(12) United States Patent
Guo et al.

(10) Patent No.: US 12,068,240 B2
(45) Date of Patent: Aug. 20, 2024

(54) CAPACITOR IN A THREE-DIMENSIONAL MEMORY STRUCTURE

(71) Applicant: Micron Technology, Inc., Boise, ID (US)

(72) Inventors: Xiaojiang Guo, San Jose, CA (US); Naveen Kaushik, Boise, ID (US); Shuai Xu, Santa Clara, CA (US); June Lee, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 481 days.

(21) Appl. No.: 17/461,435

(22) Filed: Aug. 30, 2021

(65) Prior Publication Data

US 2022/0068796 A1    Mar. 3, 2022

Related U.S. Application Data

(60) Provisional application No. 63/072,297, filed on Aug. 31, 2020.

(51) Int. Cl.
| | | |
|---|---|---|
| H01L 23/52 | (2006.01) | |
| H01L 23/522 | (2006.01) | |
| H10B 41/27 | (2023.01) | |
| H10B 41/41 | (2023.01) | |
| H10B 43/27 | (2023.01) | |
| H10B 43/40 | (2023.01) | |

(52) U.S. Cl.
CPC ......... *H01L 23/5223* (2013.01); *H10B 41/27* (2023.02); *H10B 41/41* (2023.02); *H10B 43/27* (2023.02); *H10B 43/40* (2023.02)

(58) Field of Classification Search
CPC ..... H01L 23/5223; H01L 28/40; H10B 41/27; H10B 41/41; H10B 43/27; H10B 43/40; H10B 41/42; H10B 41/50; H10B 43/50
See application file for complete search history.

(56) References Cited

U.S. PATENT DOCUMENTS

| | | | |
|---|---|---|---|
| 2003/0073282 A1* | 4/2003 | Ning | H01L 27/0805 257/E21.018 |
| 2017/0062461 A1* | 3/2017 | Takamatsu | H01L 28/40 |
| 2017/0271358 A1* | 9/2017 | Mori | H10B 41/30 |
| 2021/0036001 A1* | 2/2021 | Kim | H01L 23/5223 |
| 2021/0066277 A1* | 3/2021 | Kim | H01L 23/5228 |
| 2021/0143162 A1* | 5/2021 | Yun | G11C 16/24 |

* cited by examiner

*Primary Examiner* — S M Sohel Imtiaz

(74) *Attorney, Agent, or Firm* — Schwegman Lundberg & Woessner, P.A.

(57) ABSTRACT

Memory devices can be structured in a three-dimensional arrangement using a circuit under array (CUA) architecture. The memory array of such a memory device can include memory cells disposed in vertically arranged tiers. With the memory array extending over a substrate, the CUA region under the memory array can include control circuitry for the memory array. A space adjacent the memory array and disposed above the CUA region can include a dielectric material and conductive structures, with the conductive structures extending vertically in the dielectric material and alongside the memory array. The conductive structures separated by the dielectric material can be used as a capacitor coupled between nodes with the nodes configured to provide different voltages. This capacitor can be coupled to a circuit or a connection node below the level of the memory array.

20 Claims, 11 Drawing Sheets

CAPACITOR IN A THREE-DIMENSIONAL MEMORY STRUCTURE

PRIORITY APPLICATION

This application claims the benefit of priority to U.S. Provisional Application Ser. No. 63/072,297, filed Aug. 31, 2020, which is incorporated herein by reference in its entirety.

FIELD OF THE DISCLOSURE

Embodiments of the disclosure relate generally to memory devices and fabrication of memory devices, and more specifically, to a three-dimensional memory structure including a capacitor.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. A 3D X-Point memory is a non-volatile memory (NVM) technology with a stackable cross-grid data access array in which bit storage is based on a change of bulk resistance.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Memory arrays are being designed as 3D structures in memory devices to increase memory density. The 3D memory array extends in a horizontal plane along a substrate, which can be designated as a x-y plane, and in a vertical direction, taken as the z direction perpendicular to the x-y plane. Other design considerations can be implemented with the 3D memory arrays such as using a circuit under array (CUA) architecture to enhance reduction of die size or increase utilization of space in a die. CUA refers generally to circuitry located in a memory die under a memory array of the memory die. The CUA can include control logic and sensing circuitry for sensing the programmed data states of memory cells of the memory array. With the controlled logic and sensing circuitry fabricated below the memory array using semiconductor processing that can include CMOS (Complementary Metal Oxide Semiconductor) processing technology, CUA, in some circles, can be referred to as CMOS under array.

For a 3D NAND memory array, which can include vertical strings of memory cells, using floating gate transistors or charge trap transistors, and connections from bit lines positioned above the 3D NAND, vertical connections extending though the 3D NAND memory array or through memory breaks within the 3D NAND memory array can be used to couple to sensing circuitry and other control logic of the CUA for the memory array. A CUA architecture, which allows for circuits that operate with a 3D memory array to be structured in a space in the substrate below the 3D memory array, provides capabilities for higher densities of memory cells. These capabilities address a desire to limit increases in the area (horizontal plane) of the memory die. For continued increases in memory capacity, other design considerations should be implemented for enhancements to reduce circuit area or limit increases of circuit area in memory die.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
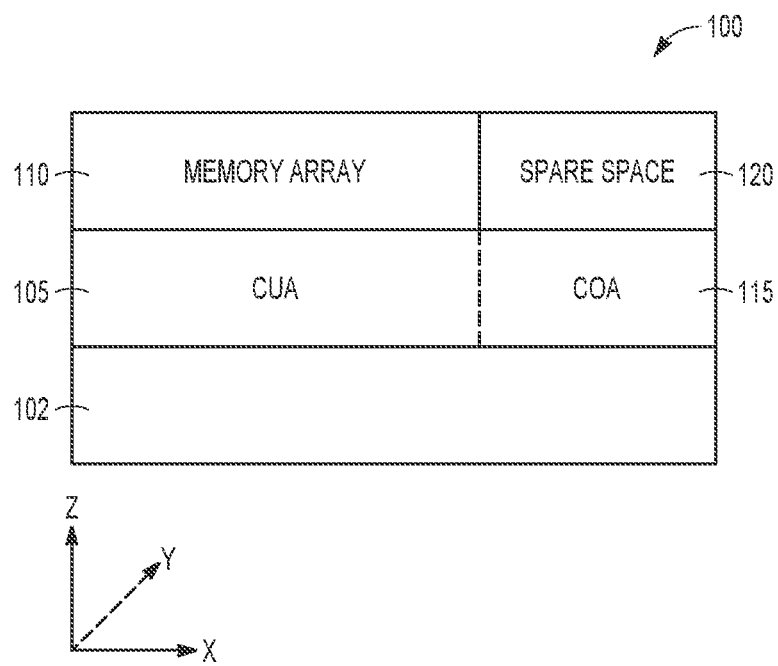
FIG. 1 is a block diagram of regions of an example memory device having a three-dimensional memory array, in which the regions are shown in the z-x plane, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In a CUA architecture for a memory die having a 3D memory array, the CUA can include circuits for controlling the operation of the 3D memory array. One or more control circuits of the CUA can provide control signals to the 3D memory array in order to perform a read operation or a write operation on the 3D memory array. The CUA can include one or more of control circuitry, state machines, decoders, sense amplifiers, read/write circuits, and controllers. These circuits can implement one or more memory array operations including erasing, programming, or reading operations. For example, the CUA can include an on-chip memory controller for determining row and column address, word line and bit line addresses, memory array enable signals, and data latching signals. The operations on the 3D memory array are typically performed to access one or more memory cells in response to requests from other circuits on the memory die or a device external to the memory die. The CUA can include pad structures to couple the memory array or one or more circuits in the CUA to other portions of the die of the memory device, or to couple to devices external to the memory device.

With vertical connections extending though the 3D memory array or through memory breaks within the 3D memory coupled to the sensing circuitry and control circuits of the CUA, the sensing circuitry and control circuits can be disposed directly beneath the 3D memory array. The pad structures to couple externally can be located below the 3D memory array and adjacent the region containing the sensing circuitry and control circuits directly beneath the 3D memory array. The region containing the pad structures can be below the 3D memory array such that there is a spare 3D space above the region containing the pad structures, with the spare 3D space adjacent the 3D memory array. The spare 3D space is considered "spare" relative to the 3D memory array, since it is beyond the horizontal extent of the 3D memory array and does not directly contain elements of the control and sensing circuitry for the 3D memory array.

In various embodiments, the 3D spare space, which is above the region containing the pad structures and is adjacent the 3D memory array, can be used to contain a capacitor. Vias, having conductive material within and separated from each other by dielectric material in this 3D spare space adjacent the 3D memory array, can be arranged as electrodes (plates) of a capacitor with the dielectric material between the vias being a capacitor dielectric for the capacitor. This allows simple, yet effective capacitors to be built by using the otherwise "wasted" spare space adjacent the 3D memory array. In addition, the region containing the pad structures can be used to contain a circuit that can couple to the capacitor in the 3D spare space. The use of the 3D spare space to contain a capacitor coupled to a circuit in region below the 3D memory array allows the avoidance of using other die area for the circuit and capacitor in the memory die.

In various embodiments, a memory device can comprise a memory array extending over a substrate; a CUA region under the memory array including control circuitry for the memory array; and a region adjacent the memory array and disposed above the CUA region. The memory array can be structured with memory cells located in a horizontal plane and in a vertical direction, providing a 3D memory array. The memory array can include multiple vertically arranged tiers comprising memory cells. The region adjacent the memory array and disposed above the CUA region can include dielectric material and conductive structures, with the conductive structures extending vertically in the dielectric material and alongside at least a portion of the memory array. The conductive structures separated by dielectric material can be arranged to form a capacitor coupled between nodes configured to provide different voltages.

The conductive structures can extend from a level at or below a bottom level of the memory array to a level at or above a top level of the memory array. With a pair of the conductive structures being plates of the capacitor, the value of the capacitor varies with the length of the conductive structures in the dielectric region alongside the memory array. With memory devices designed with increased number of vertical levels in its memory array, higher capacitance can be attained in a capacitor disposed in the dielectric region alongside the memory array. Such arrangements in spaces adjacent a 3D memory array above a CUA region can be implemented in a number of memory devices having a 3D memory array.

Various memory device formats can be structured in a CUA architecture, such as but not limited to NOR or NAND architecture semiconductor memory arrays. Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series-coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states). The sensing and control circuitry for such NOR or NAND architecture semiconductor memory arrays can be structured beneath the respective memory array in a CUA architecture.

FIG. 1 is a block diagram of regions of an embodiment of an example memory device 100 having a 3D memory array, in which the regions are shown in the z-x plane. A memory array region 110 having horizontal planes (x-y) of memory cells is disposed vertically over a CUA region 105 disposed in a substrate 102. The horizontal planes (x-y) of memory cells can be structured as multiple arranged tiers comprising memory cells. The CUA region 105 includes control circuitry for the memory array of the memory array region 110. The control circuitry can include one or more instrumentalities similar to row decoder 212, column decoder 214, sense amplifiers 220, page buffer 222, selector 224, I/O circuit 226, and memory control unit 230 of memory device 200 shown in FIG. 2. A spare space 120 is adjacent the memory array region 110 and above the CUA region 105. The spare space 120 is considered "spare" relative to the memory array of memory array region 110, since it is beyond the horizontal extent of the memory array and does not directly contain elements of the control and sensing circuitry for the memory array. The CUA region 105 can include a space of the CUA located directly below the 3D memory array of memory array region 110 such that this space of the CUA extends at least in one direction in the x-y plane to the same extent as the 3D memory array extends in this direction. The CUA region 105 can include a region in the die outside of the horizontal extent of the 3D memory array, referred to as OA, and below a level of the 3D memory array. In various embodiments, circuits or contacts can be structured outside the horizontal extent of and below a level of the 3D memory array. The circuits in this OA region can be referred to as circuits outside array, COA, in a COA region 115. The space of the COA can be disposed adjacent the portion of the space of the CUA region 105 that contains control circuitry for the memory array of the memory array region 110 and below the level of the 3D memory array.

With the memory device 100 having a COA region 115 adjacent the CUA region 105 containing control circuitry for the memory array, and placed below a level of the memory array in memory array region 110, the spare space 120 can be arranged directly over the COA region 115. The spare space 120 can be constructed to include dielectric material and conductive structures extending vertically in the dielectric material and alongside at least a portion of the memory array. The conductive structures can extend from a level at or below a bottom level of the memory array of memory array region 110 to a level at or above a top level of the memory array. The conductive structures separated by dielectric material can be arranged to form a capacitor coupled between nodes configured to provide different voltages. These nodes can be located above the spare space 120 or in the COA region 115.

Figure 2:
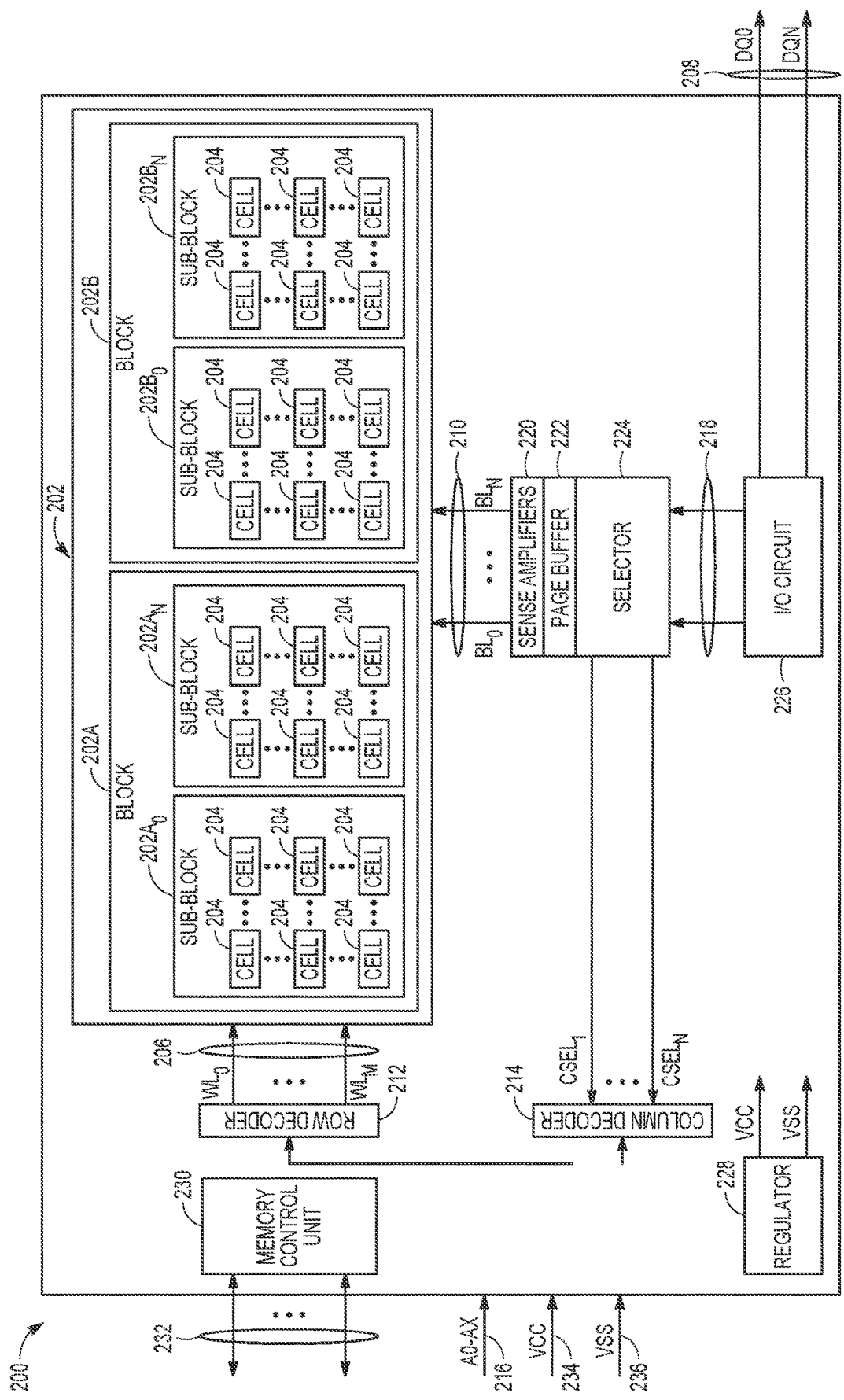
FIG. 2 illustrates an example block diagram of a memory module, according to various embodiments.
Figure 3:
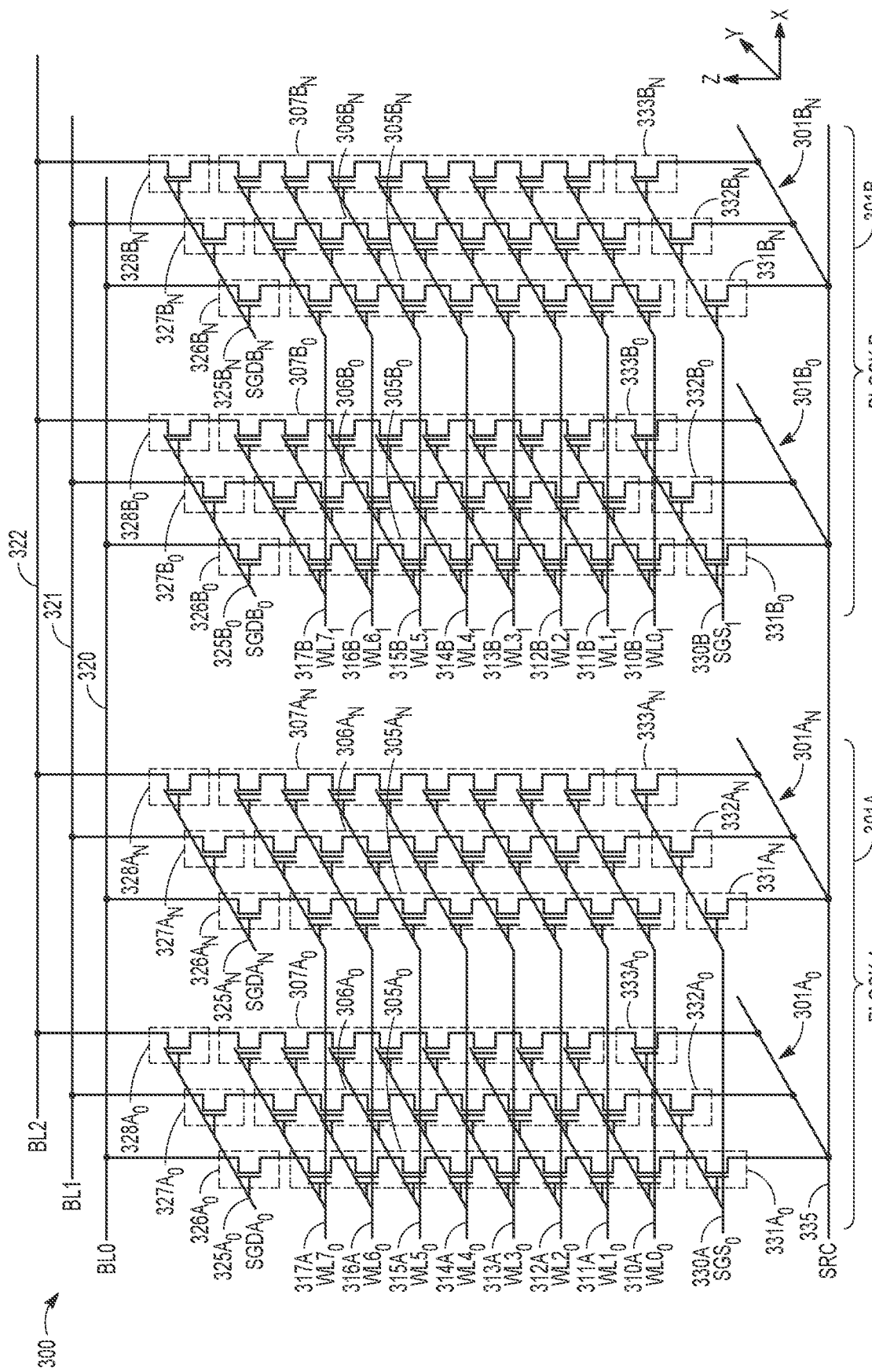
FIGS. 3 and 4 illustrate schematic diagrams of three-dimensional NAND architecture semiconductor memory arrays, according to various embodiments.
Figure 4:
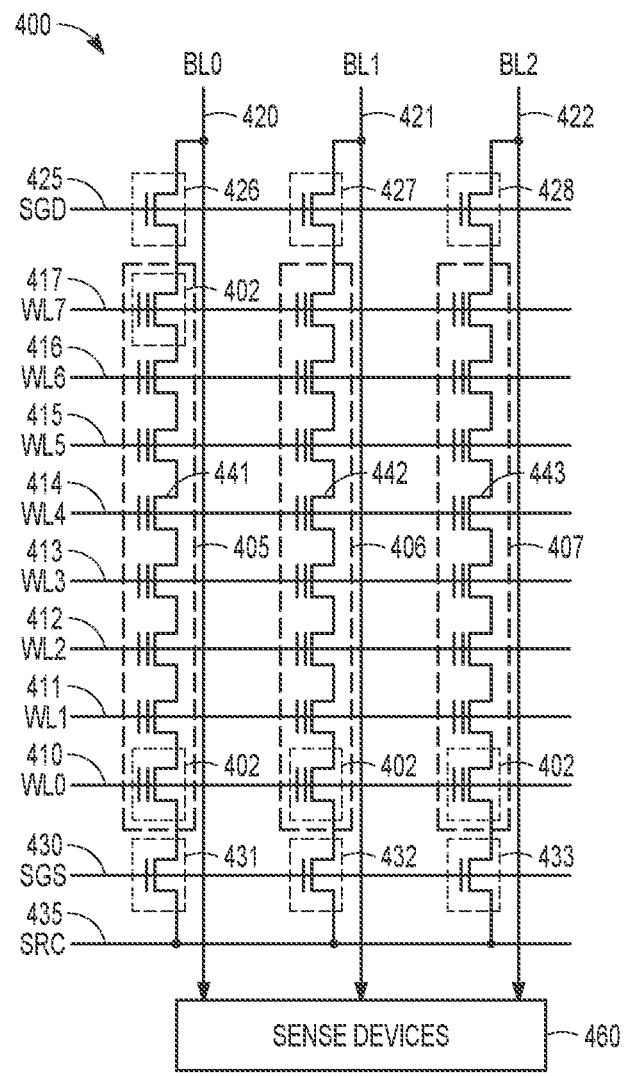

FIG. 2 illustrates a functional block diagram of an example memory device 200 including a memory array 202; and FIGS. 3-4 depict example memory array structures. Thus, FIGS. 2-4 depict example structures which may be incorporated entirely, or in part in the example NAND memory device of FIG. 5A discuss later herein. Example memory device 200 includes a plurality of memory cells 204, and one or more circuits or components to provide communication with, or perform one or more memory operations on, the memory array 202. The memory device 200 can include a row decoder 212, a column decoder 214, sense amplifiers 220, a page buffer 222, a selector 224, an I/O circuit 226, and a memory control unit 230. In various embodiments, the memory device 200 can be structured with a CUA architecture. Control circuitry for the memory array 202 can be located in a CUA region below the memory array 202 in the CUA architecture. A capacitor can be disposed in the space adjacent the memory array 202 above the CUA region of the CUA architecture, similar to the CUA region 105 of FIG. 1. The capacitor, adjacent the memory array 202, can be coupled to a node in a COA region, similar to COA region 115 of FIG. 1, that is also below the memory array 202 in the CUA architecture or to a node above the top level of the memory array 202.

The memory cells 204 of the memory array 202 can be arranged in blocks, such as first and second blocks 202A, 202B. Each block can include sub-blocks. For example, the first block 202A can include first and second sub-blocks 202A$_0$, 202A$_n$, and the second block 202B can include first and second sub-blocks 202B$_0$, 202B$_n$. Each sub-block can include a number of physical pages, with each page including a number of memory cells 204. Although illustrated herein as having two blocks, with each block having two sub-blocks, and each sub-block having a number of memory cells 204, in other examples, the memory array 202 can include more or fewer blocks, sub-blocks, memory cells, etc. In other examples, the memory cells 204 can be arranged in a number of rows, columns, pages, sub-blocks, blocks, etc., and accessed using, for example, access lines 206, first data lines 210, or one or more select gates, source lines, etc.

The memory control unit 230 can control memory operations of the memory device 200 according to one or more signals or instructions received on control lines 232, including, for example, one or more clock signals or control signals that indicate a desired operation (e.g., write, read, erase, etc.), or address signals (A0-AX) received on one or more address lines 216. One or more devices external to the memory device 200 can control the values of the control signals on the control lines 232 or the address signals on the address line 216. Examples of devices external to the memory device 200 can include, but are not limited to, a host, a memory controller, a processor, or one or more circuits or components not illustrated in FIG. 2.

The memory device 200 can use access lines 206 and first data lines 210 to transfer data to (e.g., write or erase) or from (e.g., read) one or more of the memory cells 204. The row decoder 212 and the column decoder 214 can receive and decode the address signals (A0-AX) from the address line 216, can determine which of the memory cells 204 are to be accessed, and can provide signals to one or more of the access lines 206 (e.g., one or more of a plurality of word lines (WL0-WLm)) or the first data lines 210 (e.g., one or more of a plurality of bit lines (BL0-BLn)), such as described above.

The memory device 200 can include sense circuitry, such as the sense amplifiers 220, configured to determine the values of data on (e.g., read), or to determine the values of data to be written to, the memory cells 204 using the first data lines 210. For example, in a selected string of memory cells 204, one or more of the sense amplifiers 220 can read a logic level in the selected memory cell 204 in response to a read current flowing in the memory array 202 through the selected string to the data lines 210.

One or more devices external to the memory device 200 can communicate with the memory device 200 using the I/O lines (DQ0-DQN) 208, address lines 216 (A0-AX), or control lines 232. The I/O circuit 226 can transfer values of data in or out of the memory device 200, such as in or out of the page buffer 222 or the memory array 202, using the I/O lines 208, according to, for example, the control lines 232 and address lines 216. The page buffer 222 can store data received from the one or more devices external to the memory device 200 before the data is programmed into relevant portions of the memory array 202, or can store data read from the memory array 202 before the data is transmitted to the one or more devices external to the memory device 200.

The column decoder 214 can receive and decode address signals (A0-AX) into one or more column select signals (CSEL1-CSELn). The selector 224 (e.g., a select circuit) can receive the column select signals (CSEL1-CSELn) and select data in the page buffer 222 representing values of data to be read from or to be programmed into memory cells 204. Selected data can be transferred between the page buffer 222 and the I/O circuit 226 using second data lines 218.

The memory control unit 230 can receive positive and negative supply signals, such as a supply voltage (Vcc) 234 and a negative supply (Vss) 236 (e.g., a ground potential), from an external source or supply (e.g., an internal or external battery, an AC-to-DC converter, etc.). In certain examples, the memory control unit 230 can include a regulator 228 to internally provide positive or negative supply signals.

FIG. 3 illustrates an example schematic diagram of a 3D NAND architecture semiconductor memory array 300. The 3D NAND architecture semiconductor memory array 300 can include a number of strings of memory cells (e.g., first-third $A_0$ memory strings $305A_0$-$307A_0$, first-third $A_n$ memory strings $305A_n$-$307A_n$, first-third $B_0$ memory strings $305B_0$-$307B_0$, first-third $B_n$ memory strings $305B_n$-$307B_n$, etc.), organized in blocks (e.g., block A 301A, block B 301B, etc.) and sub-blocks (e.g., sub-block $A_0$ $301A_0$, sub-block $A_n$ $301A_n$, sub-block $B_0$ $301B_0$, sub-block $B_n$ $301B_n$, etc.). The memory array 300 represents a portion of a number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 335 or a source-side select gate (SGS) (e.g., first-third $A_0$ SGS $331A_0$-$333A_0$, first-third $A_n$ SGS $331A_n$-$333A_n$, first-third $B_0$ SGS $331B_0$-$333B_0$, first-third $B_n$ SGS $331B_n$-$333B_n$, etc.) and a drain-side select gate (SGD) (e.g., first-third $A_0$ SGD $326A_0$-$328A_0$, first-third $A_n$ SGD $326A_n$-$328A_n$, first-third $B_0$ SGD $326B_0$-$328B_0$, first-third $B_n$ SGD $326B_n$-$328B_n$, etc.). Each string of memory cells in the 3D memory array 300 can be arranged along the X direction as data lines (e.g., bit lines (BL) BL0-BL2 320-322), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, with each block having two sub-blocks, each sub-block having a single physical page, each physical page having three strings of memory cells, and each string having 8 tiers of memory cells, in other examples, the memory array 300 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 300 includes a control gate (CG) coupled to (e.g., electrically or otherwise operatively connected to) an access line (e.g., word lines (WL) $WL0_0$-$WL7_0$ 310A-317A, $WL0_1$-$WL7_1$ 310B-317B, etc.), which collectively couples the control gates (CGs) across a specific tier, or a portion of a tier, as desired. Specific tiers in the 3D memory array 300, and accordingly, specific memory cells in a string, can be accessed or controlled using respective access lines. Groups of select gates can be accessed using various select lines. For example, first-third $A_0$ SGD $326A_0$-$328A_0$ can be accessed using an $A_0$ SGD line $SGDA_0$ $325A_0$, first-third $A_n$ SGD $326A_n$-$328A_n$ can be accessed using an $A_n$ SGD line $SGDA_n$ $325A_n$, first-third $B_0$ SGD $326B_0$-$328B_0$ can be accessed using a $B_0$ SGD line $SGDB_0$ $325B_0$, and first-third $B_n$ SGD $326B_n$-$328B_n$ can be accessed using a $B_n$ SGD line $SGDB_n$ $325B_n$. First-third $A_0$ SGS $331A_0$-$333A_0$ and first-third $A_n$ SGS $331A_n$-$333A_n$ can be accessed using a gate select line $SGS_0$ 330A, and first-third $B_0$ SGS $331B_0$-$333B_0$ and first-third $B_n$ SGS $331B_n$-$333B_n$ can be accessed using a gate select line $SGS_1$ 330B.

In an example, the memory array 300 can include a number of levels of semiconductor material (e.g., polysilicon, etc.) configured to couple the CGs of each memory cell or select gate (or a portion of the CGs or select gates) of a respective tier of the memory array 300. Specific strings of memory cells in the memory array 300 can be accessed, selected, or controlled using a combination of bit lines (BLs) and select gates, etc., and specific memory cells at one or more tiers in the specific strings can be accessed, selected, or controlled using one or more access lines (e.g., word lines).

In various embodiments, the memory array 300 can be structured in a CUA architecture. Control circuitry for the memory array 300 can be located in a CUA region below the memory array 300 in the CUA architecture. A capacitor can be disposed in the space adjacent the memory array 300 above the CUA region of the CUA architecture. This capacitor, adjacent the memory array 300, can be coupled to a node in a COA region that is also below the memory array 300 in the CUA architecture.

FIG. 4 illustrates an example schematic diagram of a portion of a NAND architecture semiconductor memory array 400. The portion of the NAND architecture semiconductor memory array 400 can include a plurality of memory cells 402 arranged in a 2D array of strings (e.g., first-third strings 405-407) and tiers (e.g., illustrated as respective word lines (WL) WL0-WL7 410-417, a drain-side select gate (SGD) line 425, a source-side select gate (SGS) line 430, etc.), and sense amplifiers or devices 460. For example, the memory array 400 can illustrate an example schematic diagram of a portion of one physical page of memory cells of a 3D NAND architecture semiconductor memory device, such as illustrated in FIG. 3.

Each string of memory cells is coupled to a source line (SRC) 435 using a respective source-side select gate (SGS) (e.g., first-third SGS 431-433), and to a respective data line (e.g., first-third bit lines (BL) BL0-BL2 420-422) using a respective drain-side select gate (SGD) (e.g., first-third SGD 426-428). Although illustrated with 8 tiers (e.g., using word lines (WL) WL0-WL7 410-417) and three data lines (BL0-BL2 426-428) in the example of FIG. 4, other examples can include strings of memory cells having more or fewer tiers or data lines, as desired.

In a NAND architecture semiconductor memory array, such as the example memory array 400, the state of a selected memory cell 402 can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WLA), and thus, to a control gate of each memory cell coupled to the selected word lines (e.g., first-third CGs 441-443 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers or devices 460, coupled to one or more of the data lines (e.g., first, second, or third bit lines (BL0-BL2) 420-422), can detect the state of each memory cell in respective data lines by sensing a voltage or current on a particular data line. In a CUA architecture, the sense amplifiers or devices 460 are part of the CUA beneath the memory array 400 structured in the CUA architecture.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or FN tunneling, etc.) from the floating gates of the targeted memory cells to the channels.

In various embodiments, the memory array 400 can be structured with a CUA architecture. Control circitry for the memory array 400 can be located in a CUA region below the memory array 400 in the CUA architecture. A capacitor can be disposed in the space adjacent the memory array 400 above the CUA region of the CUA architecture. The capacitor, adjacent the memory array 400, can be coupled to a node in a COA region that is also below the memory array 400 in the CUA architecture.

Figure 5A:
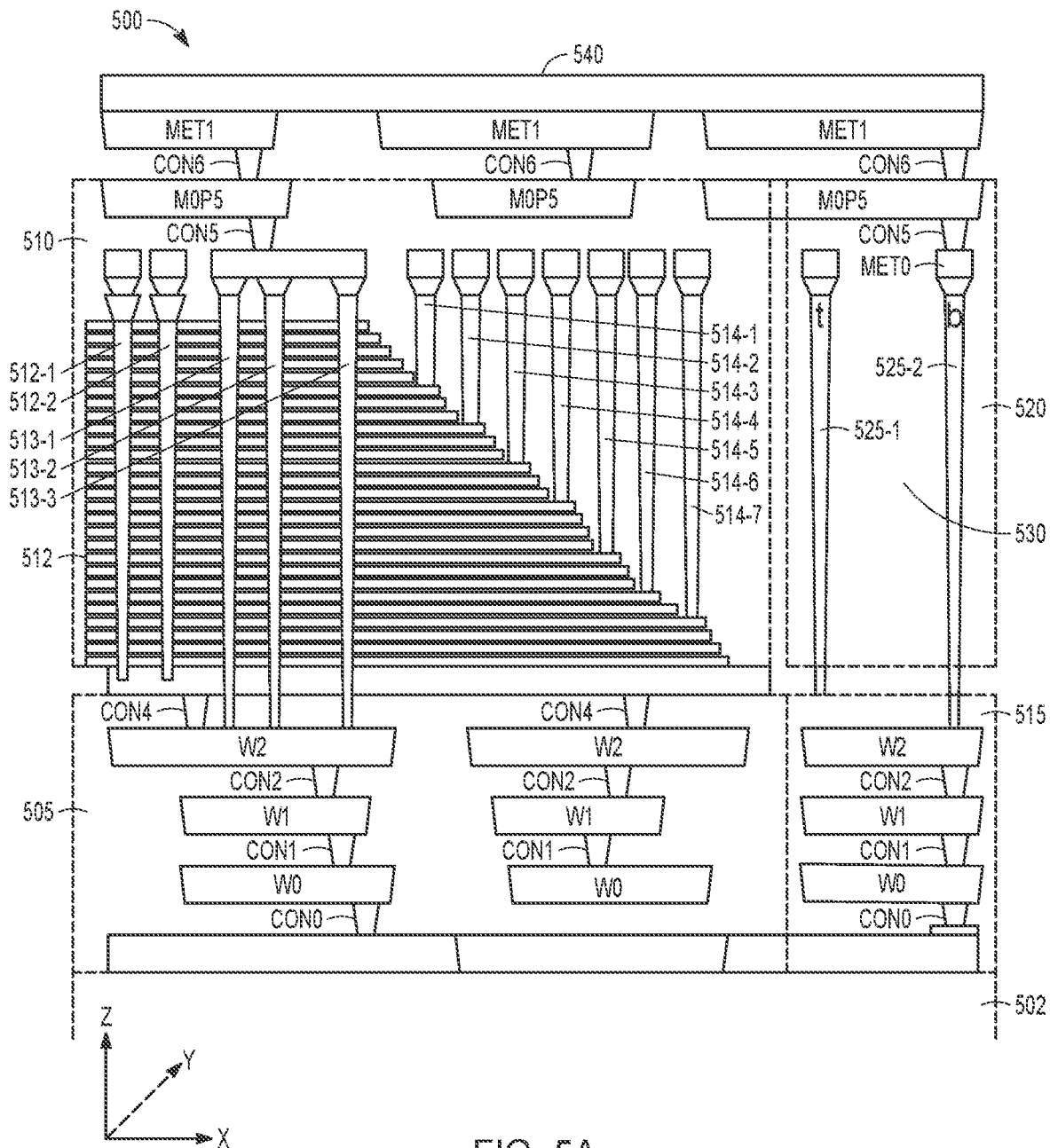
FIG. 5A is a representation of an example NAND memory device having a three-dimensional memory array, in which regions of the NAND memory device are shown in a vertical cross-section, according to various embodiments.

FIG. 5A is a representation of an embodiment of an example 3D NAND memory device 500 having a 3D memory array, in which the regions are shown in a vertical cross-section in the z-x plane. A memory array region 510 having horizontal planes (x-y) of memory cells is disposed vertically over a CUA region 505 disposed in a substrate 502. The horizontal planes (x-y) of memory cells are structured as multiple arranged tiers 512 comprising memory cells. The CUA region 505 includes control circuitry for the memory array of the memory array region 510. The control circuitry can include one or more of instrumentalities similar to row decoder 212, column decoder 214, sense amplifiers 220, page buffer 222, selector 224, I/O circuit 226, and memory control unit 230 of memory device 200 of FIG. 2 or other circuits to control access to selected memory cells of the tiers 512. A space 520, similar to the spare space 120 of FIG. 1 is adjacent the memory array region 510 and above the CUA region 505. The 3D NAND memory device 500 can have a COA region 515, as part of the CUA region 505, adjacent the section of the CUA region 505 containing the control circuitry and sensing of the the memory array in memory arrary region 510, and below a level of the memory array in memory array region 510. The space 520 can be arranged directly over the COA region 515.

Figure 5B:
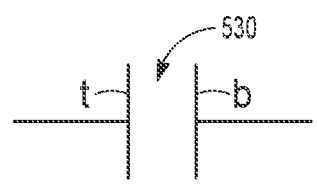
FIG. 5B is a circuit element representation of the capacitor formed by conductive plates t and b of FIG. 5A separated by a capacitor dielectric, according to various embodiments.

The space 520 includes dielectric material 530 and conductive structures 525-1 and 525-2 extending vertically in the dielectric material 530 and alongside at least a portion of the memory array of the memory array region 510. The conductive structures 525-1 and 525-2 can extend from a level at or below a bottom level of the memory array of the memory region 510 to a level at or above a top level of the memory array. Though only the two conductive structures 525-1 and 525-2 are shown in the space 520, the space 520 can include more than two conductive structures. The conductive structures 525-1 and 525-2 separated by the dielectric material 530 can be arranged to form a capacitor coupled between nodes configured to provide different voltages. These nodes can be located above the space 520 or in the COA region 515. The conductive structure 525-1 is also labeled as "t" in FIG. 5A and the conductive structure 525-2 is also labeled as "b," where t and b refer to electrodes (conductive plates) of a capacitor having dielectric material 530 as a capacitor dielectric. This capacitor can be coupled in the COA region 515 as part of a circuit in the COA region 515. FIG. 5B is a circuit element representation of the capacitor formed by conductive plates t and b of FIG. 5A separated by capacitor dielectric 530.

FIG. 5A also illustrates some of the elements of a NAND memory device having a 3D memory array. For discussion purposes, a small number of structural elements are shown in FIG. 5A. Memory cells of the tiers 512 can extend from pillars such as pillars 512-1 and 512-2. Though only two such pillars are shown, other such pillars are located with respect to the tiers 512. The 3D NAND memory device 500 can also include, but is not limited in number to, conductive contact vias 513-1, 513-2, and 513-3 along with conductive plugs 514-1 . . . 514-7. The pillars 512-1 and 512-2, the conductive contact vias 513-1, 513-2, and 513-3, and the conductive plugs 514-1 . . . 514-7 can extend above and below tiers 512 and can contact different metallization levels, which can be at various vertical locations in the structure of the 3D memory array of the memory array region 510, such that access to the memory cells in the tiers 512 can be attained by a device external to the 3D memory array. The pillars 512-1 and 512-2, the conductive contact vias 513-1, 513-2, and 513-3, and the conductive plugs 514-1 . . . 514-7, and other similar structures provide vertical connections extending though the 3D memory array or through memory breaks within the 3D memory array, which vertical connections can be used to couple to sensing circuitry and other control logic of the CUA region 505 for the 3D memory array. As a non-limiting example, FIG. 5A shows two metal layers labelled W2, two metal layers labelled W1, and two metal layers labelled W0 in the CUA region 505, where these metal layers provide electrical coupling with circuit elements in the CUA region 505. In some embodiments, metal layers may be replaced with conductively doped semiconductor material, such as but not limited to conductively doped polysilicon. Electrical connections between metal layers or conductive semiconductor layers at different vertical levels in the CUA region 505 can be provided by conductive contact vias labelled CON0, CON1, CON2, and CON4. Similarly, the COA region 515 can include metal layer labelled W2, two metal layer labelled W1, and two metal layers labelled W0 to provide electrical coupling with circuit elements in the COA region 515.

At the top of the memory region 510 and the space 520 are metal layers labelled MOP5, which metal layers can interface with a number of metallization layers labelled MET1. MET1 can be top metallizations for the die containing the 3D NAND memory device 500 and can be covered by a passivation layer 540. The passivation layer 540 is an electrically insulating layer and can include one or more materials such as, but not limited to, tetraethyl orthosilicate (TEOS) and an oxynitride. The oxynitride, for example, can include silicon oxynitride. The various MOP5 layers can couple to various MET1 layers by different contact vias CON6 and can couple to the conductive contact vias 513-1, 513-2, and 513-3 in the memory array region 510 and the conductive structures 525-1 and 525-2 in the space 520 by different contact vias CON6.

The conductive contact vias 513-1, 513-2, and 513-3, which are conductive vias in the memory array region 510, and the conductive structures 525-1 and 525-2 in the space 520 can be long conductive vias, relative to the conductive contact vias CON0, CON1, CON2, CON4, CON5, and CON6. The conductive contact vias 513-1, 513-2, and 513-3 can couple to metal layers W2 in the CUA region 505. The conductive structure 525-2 can couple to a metal layer W2 in the COA Region 515. At the end of the conductive structure 525-2, the conductive structure 525-2 can be coupled to a metal layer MET0, which layer can be coupled to layer MOP5 by via CON5. MET0 layer can be used as a jumping layer to bridge connections between below and above array metal layers. Other such relatively long structures such as the conductive contact vias 513-1, 513-2, and 513-3 can also terminate in a different metal layer MET0. The conductive structure 525-1 can couple to a node, such as a ground node, that is operationally at a different voltage than a node to which the conductive structure 525-2 is coupled. The conductive contact vias 513-1, 513-2, and 513-3 and the conductive structures 525-1 and 525-2, which can be referred to as CON3 metal, can be structured in a similar manner.

The length of the conductive structures 525-1 and 525-2 in the space 520 can depend on the number of tiers 512, as these conductive structures extend from a level at or below a bottom level of the 3D memory array of the memory region 510 to a level at or above a top level of the 3D memory array effectively defined by the number of tiers 512 in the memory device 500. With technology progressing, the number of tiers can increase from one generation of memory devices to the next. With the number of tiers increasing from one generation of memory devices to further generations, the vertical length of the 3D memory array increases, and, as a result, the CON3 height of the conductive structures 525-1 and 525-2 increases. The unit capacitance associated with conductive structures in the space 520 will increase with the processing of the 3D memory array scaling beyond the current number of tiers, such as beyond 200 tiers. The capacitance of the capacitor formed with the conductive structures is provided by the sum of the total number of unit capacitances associated with the number of conductive structures in the dielectric material 530 of the space 520.

Figure 6A:
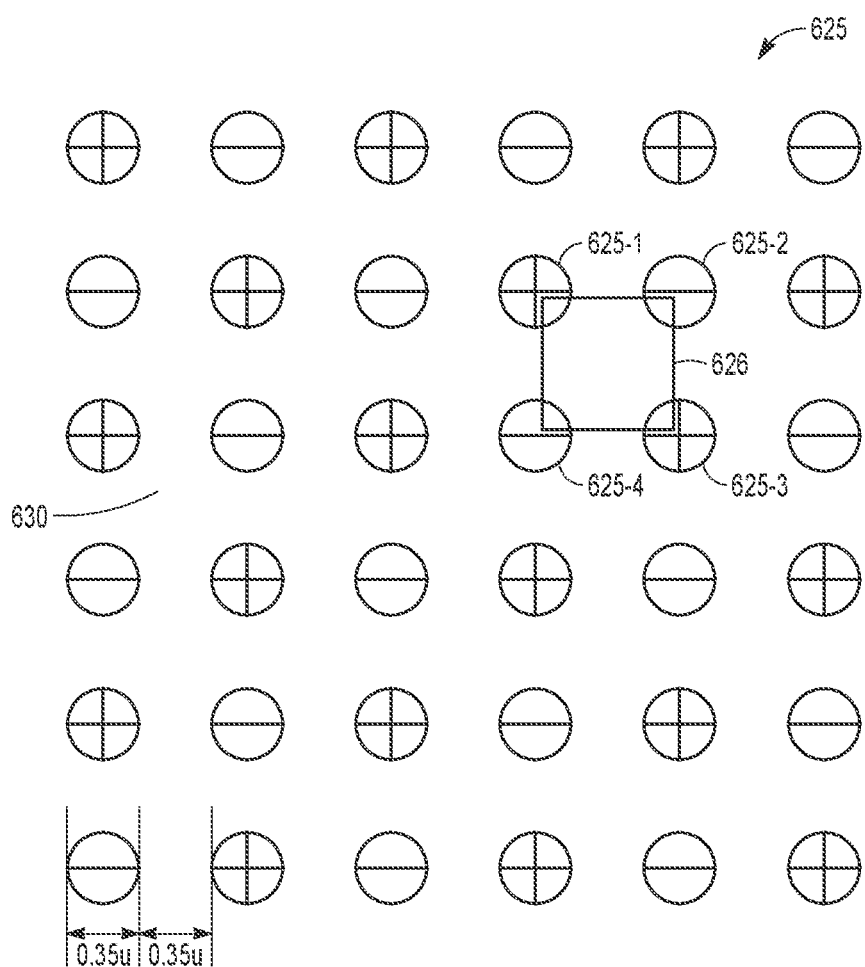
FIG. 6A is a top view of an example number of conductive structures that can be disposed in a space next to a memory array above a circuit under arrary region such as associated with FIG. 5A, according to various embodiments.

FIG. 6A is a top view of an embodiment of an example number of conductive structures that can be disposed in a space next to a 3D memory array above a CUA region such as associated with space 520 of FIG. 5A. The number of conductive structures, shown in FIG. 6A, can be arranged in a pattern 625 disposed within a dielectric material 630. The pattern 625 can be used to build a capacitor by coupling capacitance among the conductive structures in the pattern 625, where each conductive structure can be formed as a CON3 metal such as conductive structures 525-1 and 525-2 of FIG. 5A. The conductive structures can be arranged in the pattern 625 such that capacitance is provided by one or more pairs of conductive structures with the conductive structures of each pair coupled to different nodes that operatively couple the conductive plugs of the pair to different voltages. The pattern 625 is facilitated by the voltage nodes to which the conductive structures are coupled. The top of each conductive structure is shown in FIG. 6A having a plus (+) sign or a negative sign (−). The + and − signs indicate to which voltage nodes the conductive structures are coupled. The + sign indicates that the respective conductive structures are coupled to a node arranged to operatively be at a higher voltage than the node to which the respective conductive structures labelled with a − sign are coupled. Conductive structures labeled with a − sign are coupled to nodes to be operatively at the same voltage, such that effectively between these − signed conductive structures there is no capacitance contribution. Conductive structures labeled with a + sign are coupled to nodes to be operatively at the same voltage, such that effectively between these + signed conductive structures there is no capacitance contribution. A capacitor is provided in the dielectric material 630 between pairs of conductive structures in which one conductive structure of the pair is arranged as a + conductive structure and the other conductive structure of the pair is arranged as a − conductive structure. For example, each of conductive structures 625-1 and 625-2, conductive structures 625-1 and 625-4, conductive structures 625-3 and 625-2, and conductive structures 625-3 and 625-4 are paired to operationally provide a capacitance.

In the non-limiting example of FIG. 6A, the conductive structures are disposed in and separated by the dielectric material 630, where the separation distance from an edge of one conductive structure to its nearest neighboring conductive structure is 0.35 μm, with each conductive structure that is not on an edge of the pattern 625 having four nearest neighboring conductive structures. Each conductive structure, in this example, can be structured as a cylinder having a diameter of 0.35 μm and a length (height) of 10 μm. The pattern 625 can have a unit capacitance defined by a unit structure 626 of four conductive structures such as 625-1, 625-2, 625-3, 625-4. The unit capacitance is provided by a fourth of each conductive structure of the set of four conductive structures, with the set arranged such that conductive structures of the set arranged diagonally opposite each other are coupled to one or more nodes providing a voltage that is common to the diagonally opposite conductive structures. The unit capacitance can increase with process scaling beyond 200 tiers. Different patterns can be implemented to obtain larger unit capacitance and/or more friendly layout connections.

Figure 6B:
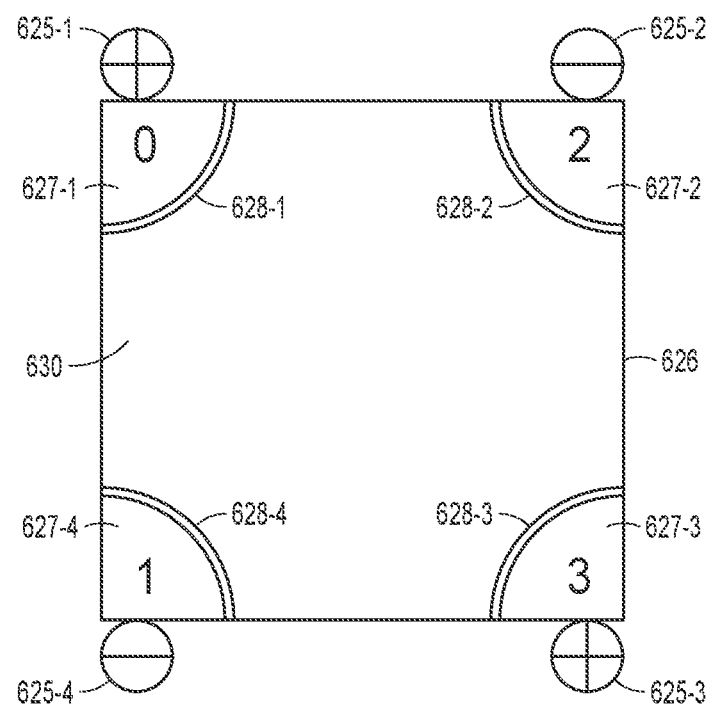
FIG. 6B shows the unit structure of FIG. 6A formed by four conductive structures disposed in dielectric material, according to various embodiments.

FIG. 6B shows the unit structure 626 of FIG. 6A formed by the four conductive structures 625-1, 625-2, 625-3, 625-4 disposed in the dielectric material 630. The conductive structure 625-1 can be structured as a metal conductive structure with an inner metal 627-1 and a barrier metal 628-1 surrounding the inner metal 627-1. The barrier metal 628-1 prevents metal elements of the inner metal 627-1 from diffusing into the dielectric material 630. The conductive structure 625-2 can be structured as a metal conductive structure with an inner metal 627-2 and a barrier metal 628-2 surrounding the inner metal 627-2. The barrier metal 628-2 prevents metal elements of the inner metal 627-2 from diffusing into the dielectric material 630. The conductive structure 625-3 can be structured as a metal conductive structure with an inner metal 627-3 and a barrier metal 628-3 surrounding the inner metal 627-3. The barrier metal 628-3 prevents metal elements of the inner metal 627-3 from diffusing into the dielectric material 630. The conductive structure 625-4 can be structured as a metal conductive structure with an inner metal 627-4 and a barrier metal 628-4 surrounding the inner metal 627-4. The barrier metal 628-4 prevents metal elements of the inner metal 627-4 from diffusing into the dielectric material 630. As an example, each of the inner metal 627-1, the inner metal 627-2, the inner metal 627-3, and the inner metal 627-4 can include tungsten. In this example, each of the barrier metal 628-1, the barrier metal 628-2, the barrier metal 628-3, and the barrier metal 628-4 can include titanium nitride.

The unit capacitance of the unit structure 626 provided by a fourth of each conductive structure of the set of four conductive structures 625-1, 625-2, 625-3, 625-4. The fourth of the conductive structure 625-1 is portion 0 of the conductive structure 625-1. The fourth of the conductive structure 625-2 is portion 2 of the conductive structure 625-2. The fourth of the conductive structure 625-3 is portion 3 of the conductive structure 625-3. The fourth of the conductive structure 625-4 is portion 1 of the conductive structure 625-4. The conductive structures of the set arranged diagonally opposite each other are coupled to one or more nodes providing a voltage that is common to the diagonally opposite conductive structures, and thus not contributing to the unit capacitance. The unit capacitance for the layout of FIG. 6A can be given by $$\mathrm{Cap} = \frac{c_{0-1} + c_{0-2} + c_{3-1} + c_{3-2}}{\mathrm{AREA}} \mathrm{fF}/\mu m^2,$$

where $C_{0-1}$ is the capacitance between the portion 0 and the portion 1, $C_{0-2}$ is the capacitance between the portion 0 and the portion 2, $C_{3-1}$ is the capacitance between the portion 3 and the portion 1, and $C_{3-2}$ is the capacitance between the portion 3 and the portion 2. As noted, there is no capacitance contribution between the portion 2 and the portion 1 and between the portion 0 and the portion 3. With titanium nitride as the metal contacting the dielectric material 630, the unit capacitance, in this example, is approximately $$\frac{4 * C_{0-1}}{\mathrm{AREA}}.$$

Figure 6C:
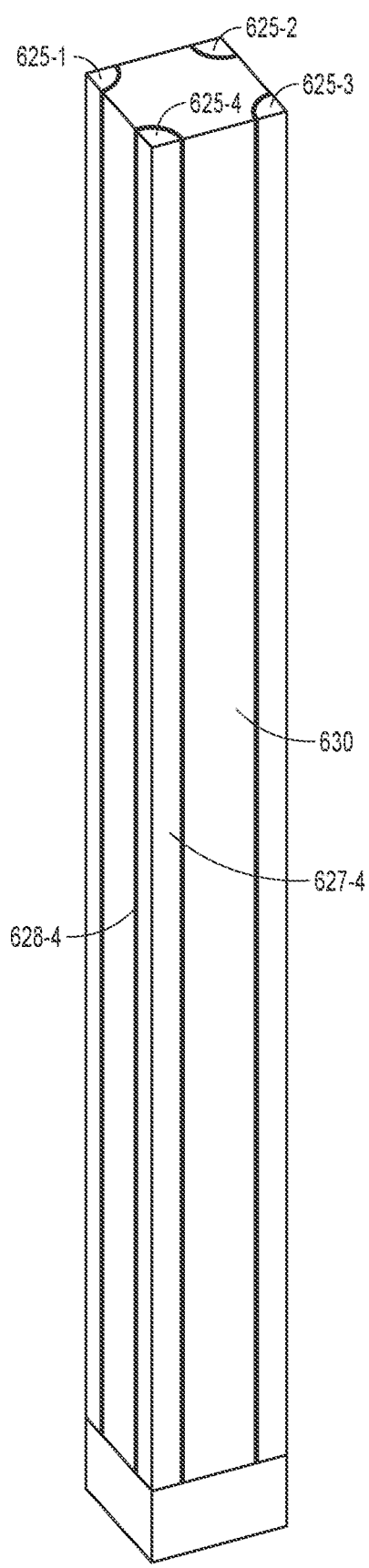
FIG. 6C shows a three-dimensional representation of portions of the four conductive structures disposed in dielectric material that define the unit structure of FIGS. 6A-6B, according to various embodiments.

FIG. 6C shows a 3D representation of the portions of the four conductive structures 625-1, 625-2, 625-3, 625-4 disposed in the dielectric material 630 that define the unit structure 626 of FIGS. 6A-6B. The dielectric material 630 can include one or more electrically insulating materials. For example, the dielectric material 630 can include an electrically insulating oxide or an electrically insulating nitride. As with other of the conductive structures that are part of the pattern 625 of FIG. 6A, each of the four conductive structures 625-1, 625-2, 625-3, 625-4 can be a metal conductive structure. Each conductive structure can include multiple metals with an outer region of the conductive structure having a metal that acts as a barrier preventing other metal within the conductive structures from diffusing into the dielectric material 630. The metal that acts as a barrier can include titanium nitride and the other metal can include tungsten. The conductive structures can be structured as conductive plugs extending from a level at or below a bottom level of the 3D memory array to a level at or above a top level of the 3D memory array. Depending on the application, the conductive structures can be hollow conductive structures. Depending on the application, the conductive structures such as the conductive structures 625-1, 625-2, 625-3, and 625-4 can be implemented with conductively doped semiconductor material. However, for low resistance associated with the conductive structures, the material of these structures can be implemented with metal material. For example, the two-terminal connections of the CON3 capacitor in the space 520 of the 3D NAND memory device 500 of FIG. 5A can be made by a W2 layer and/or a MET0 layer. The resistance-capacitance (RC) time of this metal-based capacitor can be very short.

Structures such as that of FIG. 6C can be fabricated by forming vias in dielectric material 630, formed above a COA region of a substrate, and forming conductive material in the vias. The vias can be formed by etching the dielectric material 630. The etching process can be selected based on material used for dielectric material 630 and the length of the via for forming the capacitor structured as discussed above. The conductive material can be formed in the vias using processing techniques appropriate for the dielectric material and the dimensions of the vias. The processing techniques can include, but are not limited to, chemical vapor deposition or atomic layer deposition. For conductive structures having multiple regions of conductive material, a conductive barrier can first be formed on surfaces of each via followed by forming additional conductive material on and contacting each conductive barrier in each via.

The 3D memory array to which the dielectric 630 is located adjacent can be formed with any one of a number of different processing techniques. For example, the 3D memory array can be formed as a 3D NAND memory array using a typical "gate-last" processing technique or a typical "gate-first" processing technique. The "gate-last" processing technique is also referred to as "replacement-gate" processing. In addition, the memory cells of the 3D memory array can be formed with charge storage provided by a floating gate transistor or a charge-trapping transistor. Forming the floating gate transistor can include using floating gate material such as but not limited to doped or undoped silicon. Forming the charge-trapping transistor can include using charge-trapping material such as but not limited to silicon nitride, metal dots, or other known charge-trapping material. Dielectric material, which can allow charge passage to a floating gate or a charge-trapping region, can include but is not limited to a bandgap-engineered structure having nitrogen-containing material (e.g., silicon nitride) sandwiched between two insulator oxides (e.g., silicon dioxide)."

Figure 7A:
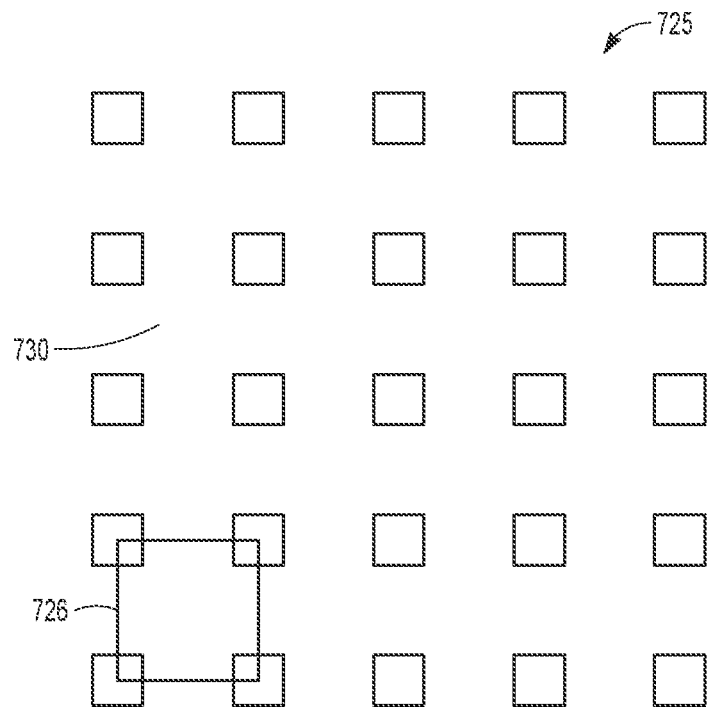
FIG. 7A is a top view of an example number of conductive structures that can be disposed in a space next to a memory array above a circuit under arrary region such as associated with FIG. 5A, according to various embodiments.

FIG. 7A is a top view of an embodiment of an example number of conductive structures that can be disposed in a space next to a 3D memory array above a CUA region such as associated with FIG. 5A. The number of conductive structures, shown in FIG. 7A, can be arranged in a pattern 725 disposed within a dielectric material 730. The pattern 725 can be used to build a capacitor by coupling capacitance among the conductive structures in the pattern 725, where material of each conductive structure can be formed as a CON3 metal such as conductive structures 525-1 and 525-2 of FIG. 5A. The conductive structures are arranged in the pattern 725 such that capacitance is provided by one or more pairs of conductive structures with the conductive structures of each pair coupled to different nodes that operatively couple the conductive plugs of the pair to different voltages. In this example, each conductive structure can be structured as a 3D structure having a cross-sectional area in the x-y plane structured as a square. The capacitance of such a structure can be provided as a combination of unit capacitances. The unit capacitance can be defined by a unit structure 726 of four conductive structures.

Figure 7B:
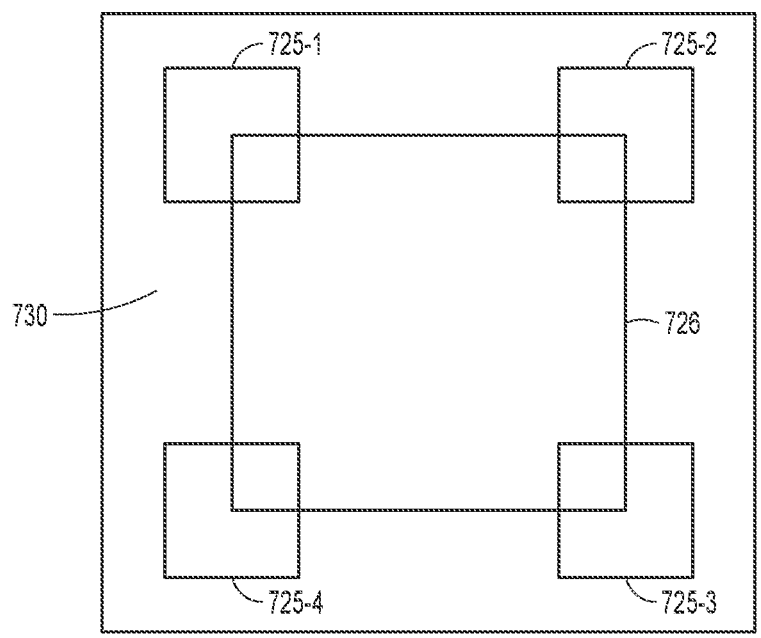
FIG. 7B shows the unit structure of FIG. 7A defined by four conductive structures, according to various embodiments.

FIG. 7B shows the unit structure 726 of FIG. 7A defined by four conductive structures 725-1, 725-2, 725-3, and 725-4. Similar to the unit structure 626 of FIGS. 6A and 6B, the unit capacitance corresponding to the unit structure 726 is provided by a fourth of each conductive structure of the set of four conductive structures 725-1, 725-2, 725-3, and 725-4 in the dielectric material 730. The conductive structures 725-1, 725-2, 725-3, and 725-4 can be paired to operationally provide a capacitance without capacitance contributions from pairs associated with diagonally arranged conductive structures of the set.

A capacitor formed by patterns of conductive structures in dielectric material as shown in FIGS. 6A and 7A can be implemented in a region such as spare space 120 of FIG. 1 or space 520 of FIG. 5A and used in a number of applications with circuits in a COA region such as COA region 115 of FIG. 1 or COA region 515 of FIG. 5A, respectively. Different patterns can be implemented to obtain larger unit capacitance and/or more friendly layout connections. This capacitor can be constructed at a dense pattern to achieve large unit capacitance and be used as decoupling capacitors and in other circuits with voltage smaller than 3.6V. It can also be structured to tolerate a high voltage, such as greater than 3.6V, to be used as a decoupling capacitor on a low and a high voltage power supply. With such a capacitor structured to tolerate a high voltage, such as greater than 3.6V, the capacitor can be used as an addition to any pump capacitors disposed in a COA region. Such a capacitor can also be used as a compensation capacitor for operational amplifier (op amp). In a memory device process, the capacitor in a space above a COA region can be used to replace some conventional device capacitor and reduce circuit area.

Figure 8:
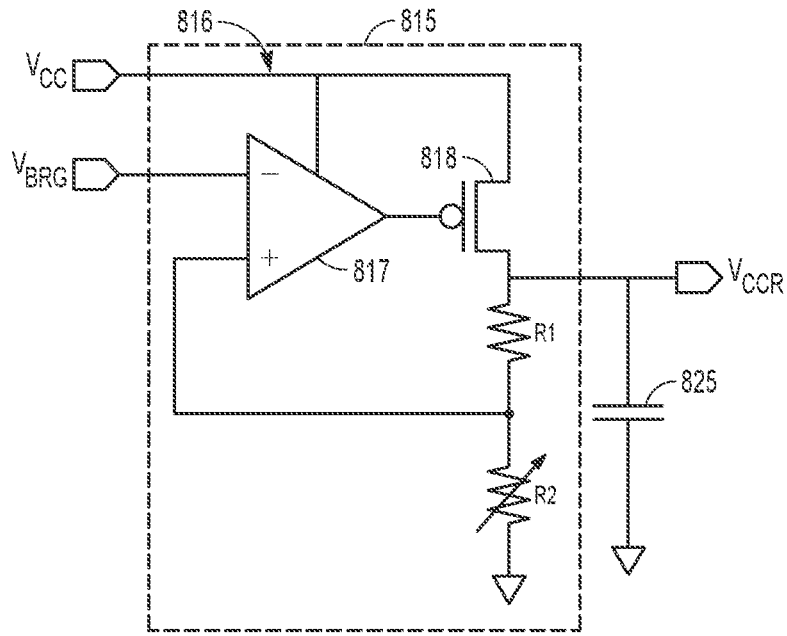
FIG. 8 shows a circuit diagram of a low dropout regulator that can be disposed in a circuit outside array region that can be coupled, in the circuit outside array region, to a capacitor disposed in a space above the circuit outside array region, according to various embodiments.

FIG. 8 shows a circuit diagram of a low dropout regulator (LDO) 816 that can be disposed in a COA region 815 of a memory device, where the COA region 815 is adjacent control and sensing circuitry of a CUA region for the memory device structured with a CUA architecture. The COA region 815 can be structured similar to the COA region 115 of FIG. 1 or the COA region 515 of FIG. 5A. The LDO 816 can be coupled, in the COA region 815, to a capacitor 825 disposed in a space above the COA region 815. The LDO 816 can provide internal voltage supply VCCR to the memory device that includes the COA region 815. The LDO 816 can include an op-amp 817, transistor 818, resistor R1, and variable resistor R2. External inputs to LDO 816 can include a supply voltage Vcc and a reference supply voltage VBRG. This reference voltage can be a bandgap reference voltage. The LDO 816 uses capacitor 825 as a decoupling capacitor to reduce ripple in VCCR. A similar circuit can be used to provide an internal voltage supply VssR to the memory device. Such circuits can provided internal voltage supplies similar to regulator 228 of FIG. 2, with these circuits in a COA region of a CUA architecture. Alternatively, such a capacitor coupled in the COA region 815 can be used as a compensation capacitor to improve stability of the circuit in the COA region 815 to which it is coupled.

Figure 9:
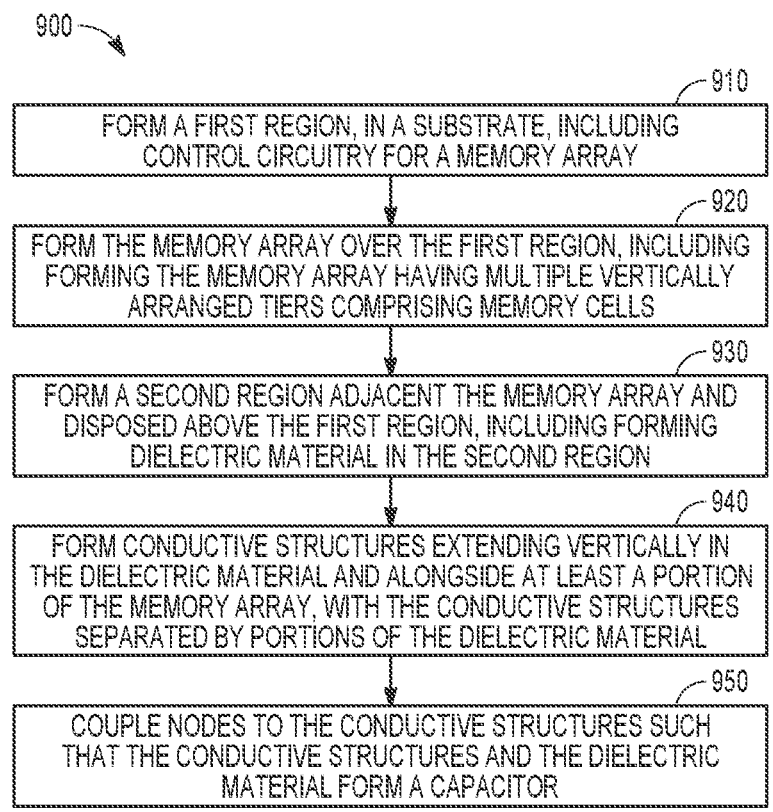
FIG. 9 is a flow diagram of features of an example method of forming a memory device, according to various embodiments.

FIG. 9 is a flow diagram of features of an embodiment of an example method 900 of forming a memory device. At 910, a first region is formed in a substrate, including forming control circuitry in the first region for a memory array. At 920, the memory array is formed over the first region, including forming the memory array having multiple vertically arranged tiers comprising memory cells. The memory array can be formed using a number of techniques or combinations of techniques for forming a memory array as a 3D structure. For example, a typical "gate-last" processing technique or a "replacement-gate" processing can be used.

At 930, a second region is formed adjacent the memory array and disposed above the first region, including forming dielectric material in the second region.

At 940, conductive structures are formed extending vertically in the dielectric material and alongside at least a portion of the memory array, with the conductive structures separated by portions of the dielectric material. Forming conductive structures can include forming vias in the dielectric material; and forming conductive material in the vias. Forming vias can include etching the dielectric material, while forming conductive material can include forming a conductive barrier on surfaces of each via and forming additional conductive material on and contacting each conductive barrier in each via. At 950, nodes are coupled to the conductive structures such that the conductive structures and the dielectric material form a capacitor.

Variations of the method 900 or methods similar to the method 900 can include a number of different embodiments that may be combined depending on the application of such methods or the architecture or process flow of an integrated circuit for which such methods are implemented. Such methods can include the conductive structures structured to extend from a level at or below a bottom level of the memory array to a level at or above a top level of the memory array. The conductive structures can be formed arranged in a pattern such that capacitance is provided by one or more pairs of conductive structures with the conductive structures of each pair coupled to different ones of the nodes that operatively couple to different voltages. The pattern can be selected from a number of different patterns to obtain larger unit capacitance or more friendly layout connections.

Variations of the method 900 or methods similar to the method 900 can include the conductive structures arranged with a unit capacitance provided by a fourth of each conductive structure of a set of four conductive structures of the conductive structures, with the set arranged such that conductive structures of the set arranged diagonally opposite each other are coupled to one or more nodes providing a voltage that is common to the diagonally opposite conductive structures. Variations can include forming the conductive structures to include forming conductive plugs extending from a level at or below a bottom level of the memory array to a level at or above a top level of the memory array. Forming the conductive structures to extend in the dielectric material in the second region can include forming the capacitor to have a capacitance per unit area equal to or greater than about 1.55 $fF/\mu m^2$.

The conductive structure can be formed as a metal conductive structure. Such a metal conductive structure can include forming each conductive structure with multiple metals with an outer region of each conductive structure having a metal that acts as a barrier preventing other metal within each conductive structure from diffusing into the dielectric material. The metal that acts as a barrier can include titanium nitride and the other metal of the conductive structure can include tungsten. Other metal compositions can be used as the barrier and the other inner metal, with combinations of metal compositions selected such that the selected barrier metal prevents elements from the selected inner conductive metal from diffusing into the dielectric material.

Variations of the method 900 or methods similar to the method 900 can include forming the dielectric material composed of one or more materials. The dielectric material can be structured to include an electrically insulating oxide or an electrically insulating nitride.

Variations of the method 900 or methods similar to the method 900 can include forming the capacitor to include coupling the capacitor to a circuit in a third region as a decoupling capacitor, with the third region disposed next to the first region under the memory array such that the second region is directly above the third region. The elements of method 900 or methods similar to the method 900 can be performed in different orders and, in various embodiments, some of the elements can be performed in a common processing step.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IOT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 10:
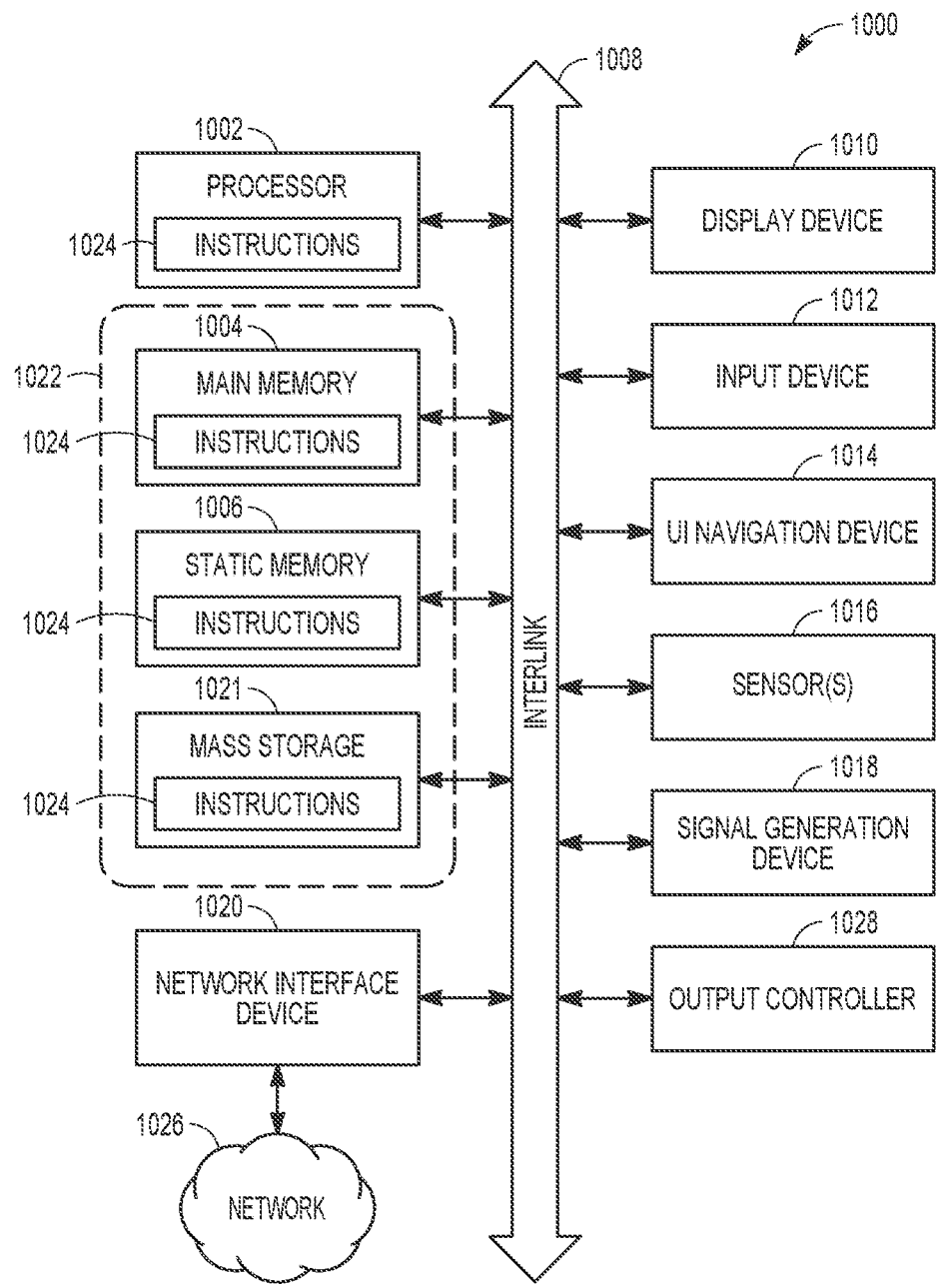
FIG. 10 is a block diagram illustrating an example of a machine upon which one or more embodiments may be implemented, according to various embodiments.

FIG. 10 illustrates a block diagram of an example machine 1000 having one or more memory devices having a CUA architecture. Such memories can include a memory array extending over a substrate, with the memory array including multiple vertically arranged tiers comprising memory cells. With a first region under the memory array including control circuitry for the memory array, a second region adjacent the memory array and disposed above the first region can include dielectric material and conductive structures, with the conductive structures extending vertically in the dielectric material and alongside at least a portion of the memory array. The conductive structures separated by dielectric material can be arranged as a capacitor coupled between nodes configured to provide different voltages. The machine 1000, having one or more such memory devices, may operate as a standalone machine or may be connected, for example networked, to other machines.

In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 1000 can be arranged to operate with one or more memory devices having a CUA architecture such as but not limited to the example memory device 100 of FIG. 1. The example machine 1000 can include one or more memory devices having structures as dicussed with respect to the memory array 200 of FIG. 2, the memory array 300 of FIG. 3, and the memory device 400 of FIG. 4.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1000 may include a hardware processor 1002 (e.g., a CPU, a GPU, a hardware processor core, or any combination thereof), a main memory 1004, and a static memory 1006, some or all of which may communicate with each other via an interlink (e.g., bus) 1008. The machine 1000 may further include a display device 1010, an alphanumeric input device 1012 (e.g., a keyboard), and a user interface (UI) navigation device 1014 (e.g., a mouse). In an example, the display device 1010, input device 1012, and UI navigation device 1014 may be a touch screen display. The machine 1000 may additionally include a storage device (e.g., drive unit) 1021, a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., USB, parallel, or other wired or wireless (e.g., infrared (IR), near field communication (NFC), etc.) connection to communicate or control one or more peripheral devices (e.g., a printer, card reader, etc.).

The machine 1000 may include a machine-readable medium 1022 on which is stored one or more sets of data structures or instructions 1024 (e.g., software) embodying or utilized by the machine 1000 to perform any one or more of the techniques or functions for which the machine 100 is designed. The instructions 1024 may also reside, completely or at least partially, within the main memory 1004, within static memory 1006, or within the hardware processor 1002 during execution thereof by the machine 1000. In an example, one or any combination of the hardware processor 1002, the main memory 1004, the static memory 1006, or the storage device 1021 may constitute the machine-readable medium 1022.

While the machine-readable medium 1022 is illustrated as a single medium, the term "machine-readable medium" may include a single medium or multiple media (e.g., a centralized or distributed database, or associated caches and servers) configured to store the one or more instructions 1024. The term "machine-readable medium" may include any medium that is capable of storing, encoding, or carrying instructions for execution by the machine 1000 and that cause the machine 1000 to perform any one or more of the techniques to which the machine 1000 is designed, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 1024 (e.g., software, programs, an operating system (OS), etc.) or other data are stored on the storage device 1021, can be accessed by the main memory 1004 for use by the processor 1002. The main memory 1004 (e.g., DRAM) is typically fast, but volatile, and thus a different type of storage than the storage device 1021 (e.g., an SSD), which is suitable for long-term storage, including while in an "off" condition. The instructions 1024 or data in use by a user or the machine 1000 are typically loaded in the main memory 1004 for use by the processor 1002. When the main memory 1004 is full, virtual space from the storage device 1021 can be allocated to supplement the main memory 1004; however, because the storage device 1021 is typically slower than the main memory 1004, and write speeds are typically at least twice as slow as read speeds, use of virtual memory can greatly reduce user experience due to storage device latency (in contrast to the main memory 1004, e.g., DRAM). Further, use of the storage device 1021 for virtual memory can greatly reduce the usable lifespan of the storage device 1021.

In contrast to virtual memory, virtual memory compression (e.g., the Linux® kernel feature "ZRAM") uses part of the memory as compressed block storage to avoid paging to the storage device 1021. Paging takes place in the compressed block until it is necessary to write such data to the storage device 1021. Virtual memory compression increases the usable size of main memory 1004, while reducing wear on the storage device 1021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 1024 may further be transmitted or received over a communications network 1026 using a transmission medium via the network interface device 1020 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 1000, and includes instrumentalities to propagate digital or analog communications signals to facilitate communication of such instructions, which instructions may be implemented by software.

The following are example embodiments of devices and methods, in accordance with the teachings herein.

An example memory device 1 can comprise: a memory array extending over a substrate, the memory array including multiple vertically arranged tiers comprising memory cells; a first region under the memory array including control circuitry for the memory array; and a second region adjacent the memory array and disposed above the first region, the second region including: dielectric material, and conductive structures extending vertically in the dielectric material and alongside at least a portion of the memory array, the conductive structures separated by dielectric material and arranged to form a capacitor coupled between nodes configured to provide different voltages.

An example memory device 2 can include features of example memory device 1 and can include the dielectric material to include one or more materials.

An example memory device 3 can include features of any of the preceding example memory devices and can include the conductive structures being conductive plugs extending from a level at or below a bottom level of the memory array to a level at or above a top level of the memory array.

An example memory device 4 can include features of any of the preceding example memory devices and can include a third region next to the first region under the memory array such that the second region is directly above the third region.

An example memory device 5 can include features of example memory device 4 and any of the preceding example memory devices and can include the capacitor being coupled in the third region as part of a circuit in the third region.

An example memory device 6 can include features of any of the preceding example memory devices and can include the conductive structures being arranged in a pattern such that capacitance is provided by one or more pairs of conductive structures with the conductive structures of each pair coupled to different nodes that operatively couple the conductive plugs of the pair to different voltages.

An example memory device 7 can include features of any of the preceding example memory devices and can include unit capacitance being provided by a fourth of each conductive structure of a set of four conductive structures of the conductive structures, with the set arranged such that conductive structures of the set arranged diagonally opposite each other are coupled to one or more nodes providing a voltage that is common to the diagonally opposite conductive structures.

An example memory device 8 can include features of any of the preceding example memory devices and can include the capacitor having a capacitance per unit area equal to or greater than about 1.55 fF/$\mu m^2$.

An example memory device 9 can include features of any of the preceding example memory devices and can include each conductive structure being a metal conductive structure.

An example memory device 10 can include features of any of the preceding example memory devices and can include each conductive structure including multiple metals with an outer region of the conductive structure having a metal that acts as a barrier preventing other metal within the conductive structures from diffusing into the dielectric material.

An example memory device 11 can include features of memory device 10 and any of the preceding example memory devices and can include the metal that acts as a barrier including titanium nitride and the other metal including tungsten.

An example memory device 12 can include features of any of the preceding example memory devices and can include the dielectric material including an electrically insulating oxide or an electrically insulating nitride.

In an example memory device 13, any of the memory devices of example memory devices 1 to 12 may include memory devices incorporated into an electronic memory apparatus further comprising a host processor and a communication bus extending between the host processor and the memory device.

In an example memory device 14, any of the memory devices of example memory devices 1 to 13 may be modified to include any structure presented in another of example memory device 1-13.

In an example memory device 15, any apparatus associated with the memory devices of example memory devices 1 to 14 may further include a machine-readable storage device configured to store instructions as a physical state, wherein the instructions may be used to perform one or more operations of the apparatus.

In an example memory device 16, any of the memory devices of example memory devices 1 to 15 may be formed in accordance with any of the methods of the below example methods 1-14.

An example memory device 17 can comprise: a memory array extending over a substrate, the memory array including multiple vertically arranged tiers comprising memory cells;

a first region under the memory array including control circuitry for the memory array; a second region adjacent the first region under the memory array and outside a horizontal extent of the memory array, the second region having pads to couple to the control circuitry; a third region adjacent the memory array and disposed above the second region, the third region including: dielectric material, and conductive structures extending vertically in the dielectric material and alongside at least a portion of the memory array, the conductive structures separated by dielectric material and arranged to form a capacitor; and nodes coupled to the conductive structures such that the nodes are configured to operatively provide different voltages to selected ones of the conductive structures.

An example memory device 18 can include features of example memory device 17 and can include the conductive structures extending from a level at or below a bottom level of the memory array to a level at or above a top level of the memory array.

An example memory device 19 can include features of any of the preceding example memory devices 17 and 18 and can include the conductive structures being arranged in a pattern such that capacitance is provided by one or more pairs of conductive structures with the conductive structures of each pair coupled to different nodes that operatively couple the conductive plugs of the pair to different voltages.

An example memory device 20 can include features of any of the preceding example memory devices 17-19 and can include unit capacitance being provided by a fourth of each conductive structure of a set of four conductive structures of the conductive structures, with the set arranged such that conductive structures of the set arranged diagonally opposite each other are coupled to one or more nodes providing a voltage that is common to the diagonally opposite conductive structures.

An example memory device 21 can include features of any of the preceding example memory devices 17-20 and can include the dielectric material including one or more materials.

An example memory device 22 can include features of any of the preceding example memory devices 17-21 and can include the conductive structures being conductive plugs extending from a level at or below a bottom level of the memory array to a level at or above a top level of the memory array.

An example memory device 23 can include features of any of the preceding example memory devices 17-22 and can include the capacitor being coupled in the second region as a decoupling capacitor in the second region.

An example memory device 24 can include features of any of the preceding example memory devices 17-23 and can include the capacitor having a capacitance per unit area equal to or greater than about 1.55 fF/$\mu m^2$.

An example memory device 25 can include features of any of the preceding example memory devices 17-24 and can include each conductive structure being a metal conductive structure.

An example memory device 26 can include features of any of the preceding example memory devices 17-25 and can include each conductive structure including multiple metals with an outer region of the conductive structure having a metal that acts as a barrier preventing other metal within the conductive structure from diffusing into the dielectric material.

An example memory device 27 can include features of example memory device 26 and any of the preceding example memory devices 17-26 and can include the metal that acts as a barrier including titanium nitride and the other metal including tungsten.

An example memory device 28 can include features of any of the preceding example memory devices 17-27 and can include the dielectric material including an electrically insulating oxide or an electrically insulating nitride.

In an example memory device 29, any of the memory devices of example memory devices 17 to 28 may include memory devices incorporated into an electronic memory apparatus further comprising a host processor and a communication bus extending between the host processor and the memory device.

In an example memory device 30, any of the memory devices of example memory devices 17 to 29 may be modified to include any structure presented in another of example memory device 17-29.

In an example memory device 31, any apparatus associated with the memory devices of example memory devices 17 to 30 may further include a machine-readable storage device configured to store instructions as a physical state, wherein the instructions may be used to perform one or more operations of the apparatus.

In an example memory device 32, any of the memory devices of example memory devices 17 to 31 may be formed in accordance with any of the methods of the following example methods 1-14.

An example method 1 of forming a memory device can comprise: forming a first region, in a substrate, including control circuitry for a memory array; forming the memory array over the first region, including forming the memory array having multiple vertically arranged tiers comprising memory cells; forming a second region adjacent the memory array and disposed above the first region, including forming dielectric material in the second region; forming conductive structures extending vertically in the dielectric material and alongside at least a portion of the memory array, with the conductive structures separated by portions of the dielectric material; and coupling nodes to the conductive structures such that the conductive structures and the dielectric material form a capacitor.

An example method 2 of forming a memory device can include features of example method 1 of forming a memory device and can include forming conductive structures to include: forming vias in the dielectric material; and forming conductive material in the vias.

An example method 3 of forming a memory device can include features of example method 2 of forming a memory device and features of any of the preceding example methods of forming a memory device and can include forming vias to include etching the dielectric material and forming conductive material includes forming a conductive barrier on surfaces of each via and forming additional conductive material on and contacting each conductive barrier in each via.

An example method 4 of forming a memory device can include features of example method 3 of forming a memory device and features of any of the preceding example methods of forming a memory device and can include forming the conductive structures to include forming the conductive structures arranged in a pattern such that capacitance is provided by one or more pairs of conductive structures with the conductive structures of each pair coupled to different ones of the nodes that operatively couple to different voltages.

An example method 5 of forming a memory device can include features of example method 4 of forming a memory device and features of any of the preceding example methods of forming a memory device and can include forming the conductive structures to include forming the conductive structures arranged with a unit capacitance provided by a fourth of each conductive structure of a set of four conductive structures of the conductive structures, with the set arranged such that conductive structures of the set arranged diagonally opposite each other are coupled to one or more nodes providing a voltage that is common to the diagonally opposite conductive structures.

An example method 6 of forming a memory device can include features of example method 5 of forming a memory device and features of any of the preceding example methods of forming a memory device and can include forming the conductive structures to include forming the conductive structures to extend from a level at or below a bottom level of the memory array to a level at or above a top level of the memory array.

An example method 7 of forming a memory device can include features of any of the preceding example methods of forming a memory device and can include forming the conductive structures to include forming conductive plugs extending from a level at or below a bottom level of the memory array to a level at or above a top level of the memory array.

An example method 8 of forming a memory device can include features of any of the preceding example methods of forming a memory device and can include forming the dielectric material to include forming the dielectric material composed of one or more materials.

An example method 9 of forming a memory device can include features of any of the preceding example methods of forming a memory device and can include forming the capacitor to include coupling the capacitor to a circuit in a third region as a decoupling capacitor, with the third region disposed next to the first region under the memory array such that the second region is directly above the third region.

An example method 10 of forming a memory device can include features of any of the preceding example methods of forming a memory device and can include forming the capacitor having a capacitance per unit area equal to or greater than about 1.55 fF/$\mu m^2$.

An example method 11 of forming a memory device can include features of any of the preceding example methods of forming a memory device and can include forming the conductive structure as a metal conductive structure.

An example method 12 of forming a memory device can include features of any of the preceding example methods of forming a memory device and can include forming each conductive structure with multiple metals with an outer region of each conductive structure having a metal that acts as a barrier preventing other metal within each conductive structure from diffusing into the dielectric material.

An example method 13 of forming a memory device can include features of example method 12 of forming a memory device and any of the preceding example methods of forming a memory device and can include the metal that acts as a barrier including titanium nitride and the other metal including tungsten.

An example method 14 of forming a memory device can include features of any of the preceding example methods of forming a memory device and can include forming the dielectric material to include forming an electrically insulating oxide or forming an electrically insulating nitride.

In an example method 15 of forming a memory device, any of the example methods 1-14 of forming a memory device may be performed in forming an electronic associated with a memory device.

In an example method 16 of forming a memory device, any of the example methods 1-15 of forming a memory device may be modified to include operations set forth in any other of method examples 1-15 of forming a memory device.

In an example method 17 of forming a memory device, any of the example methods 1-16 of forming a memory device may be implemented at least in part through use of instructions stored as a physical state in one or more machine-readable storage devices.

An example method 18 of forming a memory device can include features of any of the preceding example methods 1-17 of forming a memory device and can include performing functions associated with any features of example memory devices 1-31.

An example machine-readable storage device 1 storing instructions that, when executed by one or more processors, cause a machine to perform operations, can comprise instructions to perform functions associated with any features of example memory devices 1-32 or perform methods associated with any features of example methods 1-18.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A memory device comprising:
   a memory array extending over a substrate in a memory die, the memory array including multiple vertically arranged tiers comprising memory cells;
   a first region, in the memory die, under the memory array including control circuitry for the memory array; and
   a second region, in the memory die, adjacent the memory array and disposed above the first region, the second region including:
   dielectric material; and
   conductive structures extending vertically in the dielectric material and alongside at least a portion of the memory array, the conductive structures separated by dielectric material and arranged to form a capacitor coupled between nodes configured to provide different voltages, at least two of the nodes being electrically isolated and separate from each other.

2. The memory device of claim 1, wherein the dielectric material includes one or more materials.

3. The memory device of claim 1, wherein the conductive structures are conductive plugs extending from a level at or below a bottom level of the memory array to a level at or above a top level of the memory array.

4. The memory device of claim 1, wherein the memory device includes a third region next to the first region under the memory array such that the second region is directly above the third region.

5. The memory device of claim 4, wherein the capacitor is coupled in the third region as part of a circuit in the third region.

6. The memory device of claim 1, wherein the conductive structures are arranged in a pattern such that capacitance is provided by one or more pairs of conductive structures with the conductive structures of each pair coupled to different nodes that operatively couple the conductive structures of the pair to different voltages.

7. The memory device of claim 1, wherein unit capacitance is provided by a fourth of each conductive structure of a set of four conductive structures of the conductive structures, with the set arranged such that conductive structures of the set arranged diagonally opposite each other are coupled to one or more nodes providing a voltage that is common to the diagonally opposite conductive structures.

8. The memory device of claim 1, wherein the capacitor has a capacitance per unit area equal to or greater than about 1.55 fF/$\mu$m$^2$.

9. The memory device of claim 1, wherein each conductive structure is a metal conductive structure.

10. The memory device of claim 1, wherein each conductive structure includes multiple metals with an outer region of the conductive structure having a metal that acts as a barrier preventing other metal within the conductive structures from diffusing into the dielectric material.

11. The memory device of claim 10, wherein the metal that acts as a barrier includes titanium nitride and the other metal includes tungsten.

12. The memory device of claim 1, wherein the dielectric material includes an electrically insulating oxide or an electrically insulating nitride.

13. A memory device comprising:
a memory array extending over a substrate in a memory die, the memory array including multiple vertically arranged tiers comprising memory cells;
a first region, in the memory die, under the memory array including control circuitry for the memory array;
a second region, in the memory die, adjacent the first region under the memory array and outside a horizontal extent of the memory array, the second region having pads to couple to the control circuitry;
a third region, in the memory die, adjacent the memory array and disposed above the second region, the third region including:
dielectric material; and
conductive structures extending vertically in the dielectric material and alongside at least a portion of the memory array, the conductive structures separated by dielectric material and arranged to form a capacitor; and
nodes coupled to the conductive structures such that the nodes are configured to operatively provide different voltages to selected ones of the conductive structures, at least two of the nodes being electrically isolated and separate from each other.

14. The memory device of claim 13, wherein the conductive structures extend from a level at or below a bottom level of the memory array to a level at or above a top level of the memory array.

15. The memory device of claim 13, wherein the conductive structures are arranged in a pattern such that capacitance is provided by one or more pairs of conductive structures with the conductive structures of each pair coupled to different nodes that operatively couple the conductive structures of the pair to different voltages.

16. The memory device of claim 13, wherein unit capacitance is provided by a fourth of each conductive structure of a set of four conductive structures of the conductive structures, with the set arranged such that conductive structures of the set arranged diagonally opposite each other are coupled to one or more nodes providing a voltage that is common to the diagonally opposite conductive structures.

17. A method of forming a memory device, the method comprising:
forming a first region, in a substrate of a memory die, including control circuitry for a memory array;
forming the memory array over the first region, including forming the memory array having multiple vertically arranged tiers comprising memory cells;
forming a second region, in the memory die, adjacent the memory array and disposed above the first region, including forming dielectric material in the second region;
forming conductive structures, in the memory die, extending vertically in the dielectric material and alongside at least a portion of the memory array, with the conductive structures separated by portions of the dielectric material; and
coupling nodes, in the memory die, to the conductive structures such that the conductive structures and the dielectric material form a capacitor, at least two of the nodes formed being electrically isolated and separate from each other.

18. The method of claim 17, wherein forming conductive structures includes:
forming vias in the dielectric material; and
forming conductive material in the vias.

19. The method of claim 18, wherein forming vias includes etching the dielectric material and forming conductive material includes forming a conductive barrier on surfaces of each via and forming additional conductive material on and contacting each conductive barrier in each via.

20. The method of claim 17, wherein forming the conductive structures includes forming the conductive structures arranged in a pattern such that capacitance is provided by one or more pairs of conductive structures with the conductive structures of each pair coupled to different ones of the nodes that operatively couple to different voltages.

* * * * *